(12) United States Patent
Yamazaki et al.

(10) Patent No.: US 7,915,099 B2
(45) Date of Patent: Mar. 29, 2011

(54) BEAM IRRADIATION APPARATUS, BEAM IRRADIATION METHOD, AND METHOD FOR MANUFACTURING SEMICONDUCTOR DEVICE

(75) Inventors: Shunpei Yamazaki, Setagaya (JP); Koichiro Tanaka, Atsugi (JP); Hidekazu Miyairi, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 262 days.

(21) Appl. No.: 11/785,966

(22) Filed: Apr. 23, 2007

(65) Prior Publication Data

US 2007/0196968 A1 Aug. 23, 2007

Related U.S. Application Data

(62) Division of application No. 10/820,781, filed on Apr. 9, 2004, now Pat. No. 7,220,627.

(30) Foreign Application Priority Data

Apr. 21, 2003 (JP) ................................. 2003-116391

(51) Int. Cl.
*H01L 21/00* (2006.01)
*H01L 21/84* (2006.01)
*H01L 21/20* (2006.01)
*H01L 21/36* (2006.01)
(52) U.S. Cl. .. 438/149; 438/166; 438/486; 257/E21.124
(58) Field of Classification Search .................. 438/166, 438/149, 486, 487; 257/E21.561, E21.124
See application file for complete search history.

(56) References Cited

U.S. PATENT DOCUMENTS

| 4,330,363 A | 5/1982 | Biegesen et al. |
| 4,439,245 A | 3/1984 | Wu |
| 4,504,354 A | 3/1985 | George et al. |
| 5,365,875 A | 11/1994 | Asai et al. |

(Continued)

FOREIGN PATENT DOCUMENTS

JP 01-146320 6/1989

(Continued)

OTHER PUBLICATIONS

Specification, claims, abstract of U.S. Appl. No. 10/827,402, filed Apr. 20, 2004.

*Primary Examiner* — David S Blum
(74) *Attorney, Agent, or Firm* — Eric J. Robinson; Robinson Intellectual Property Law Office, P.C.

(57) ABSTRACT

The speed of the laser scanned by the scanning means such as a galvanometer mirror or a polygon mirror is not constant in the center portion and in the end portion of the scanning width. As a result, the object, for example an amorphous semiconductor film, is irradiated with the excessive energy and therefore there is a risk that the amorphous semiconductor film is peeled. In the present invention, in the case where the laser spot of the energy beam output continuously on the irradiated object is scanned by moving it back and forth with the use of the scanning means or the like, the beam is irradiated to the outside of the element-forming region when the scanning speed of the spot is not the predetermined value, for example when the speed is not constant, and accelerates, decelerates, or is zero, for example in the positions where the scanning direction changes, or where the scanning starts or ends.

66 Claims, 5 Drawing Sheets

U.S. PATENT DOCUMENTS

| | | | | |
|---|---|---|---|---|
| 5,712,191 | A | 1/1998 | Nakajima et al. | |
| 5,756,364 | A | 5/1998 | Tanaka et al. | |
| 5,815,494 | A | 9/1998 | Yamazaki et al. | |
| 5,835,249 | A | 11/1998 | Yamada et al. | |
| 5,854,803 | A | 12/1998 | Yamazaki et al. | |
| 5,893,990 | A * | 4/1999 | Tanaka | 219/121.8 |
| 5,896,233 | A | 4/1999 | Soda et al. | |
| 5,932,118 | A | 8/1999 | Yamamoto et al. | |
| 6,087,277 | A | 7/2000 | Shih et al. | |
| 6,156,997 | A | 12/2000 | Yamazaki et al. | |
| 6,235,614 | B1 | 5/2001 | Yang | |
| 6,246,524 | B1 | 6/2001 | Tanaka | |
| 6,274,414 | B1 | 8/2001 | Ogata et al. | |
| 6,322,625 | B2 | 11/2001 | Im | |
| 6,341,042 | B1 | 1/2002 | Matsunaka et al. | |
| 6,429,100 | B2 | 8/2002 | Yoneda | |
| 6,495,405 | B2 | 12/2002 | Voutsas et al. | |
| 6,506,635 | B1 | 1/2003 | Yamazaki et al. | |
| 6,528,758 | B2 | 3/2003 | Shaffer | |
| 6,534,744 | B1 | 3/2003 | Yamazaki et al. | |
| 6,563,077 | B2 | 5/2003 | Im | |
| 6,573,163 | B2 | 6/2003 | Voutsas et al. | |
| 6,696,667 | B1 * | 2/2004 | Flanagan | 219/121.72 |
| 6,700,096 | B2 | 3/2004 | Yamazaki et al. | |
| 6,737,306 | B2 | 5/2004 | Yamazaki et al. | |
| 6,737,672 | B2 | 5/2004 | Hara et al. | |
| 6,770,546 | B2 | 8/2004 | Yamazaki | |
| 6,777,276 | B2 | 8/2004 | Crowder et al. | |
| 6,797,550 | B2 | 9/2004 | Kokubo et al. | |
| 6,818,568 | B2 | 11/2004 | Tanaka | |
| 6,821,343 | B2 | 11/2004 | Hara et al. | |
| 6,849,482 | B2 | 2/2005 | Yamazaki et al. | |
| 6,849,825 | B2 | 2/2005 | Tanaka | |
| 6,897,889 | B2 | 5/2005 | Tanaka | |
| 6,919,533 | B2 | 7/2005 | Yamazaki et al. | |
| 6,944,195 | B2 | 9/2005 | Yamazaki et al. | |
| 6,949,452 | B2 * | 9/2005 | Hatano et al. | 438/488 |
| 6,982,396 | B2 | 1/2006 | Yamazaki et al. | |
| 6,984,573 | B2 | 1/2006 | Yamazaki et al. | |
| 7,078,281 | B2 | 7/2006 | Tanaka et al. | |
| 7,078,322 | B2 | 7/2006 | Tanada et al. | |
| 7,109,073 | B2 * | 9/2006 | Yamazaki | 438/150 |
| 7,112,517 | B2 | 9/2006 | Tanaka et al. | |
| 7,125,761 | B2 | 10/2006 | Tanaka | |
| 7,164,152 | B2 | 1/2007 | Im | |
| 7,180,091 | B2 | 2/2007 | Yamazaki et al. | |
| 7,220,627 | B2 | 5/2007 | Yamazaki et al. | |
| 7,223,938 | B2 | 5/2007 | Yamazaki et al. | |
| 7,259,082 | B2 | 8/2007 | Tanaka | |
| 2003/0021307 | A1 * | 1/2003 | Yamazaki | 372/24 |
| 2003/0094611 | A1 * | 5/2003 | Hayakawa | 257/49 |
| 2003/0166315 | A1 * | 9/2003 | Tanada et al. | 438/166 |
| 2003/0218171 | A1 * | 11/2003 | Isobe et al. | 257/64 |
| 2003/0224587 | A1 | 12/2003 | Yamazaki et al. | |
| 2004/0074881 | A1 | 4/2004 | Oishi | |
| 2004/0140297 | A1 | 7/2004 | Tanaka et al. | |
| 2004/0209410 | A1 | 10/2004 | Tanaka | |
| 2004/0266223 | A1 | 12/2004 | Tanaka et al. | |
| 2005/0036190 | A1 | 2/2005 | Tanaka | |
| 2005/0037552 | A1 | 2/2005 | Yamazaki et al. | |
| 2005/0092998 | A1 | 5/2005 | Yamazaki et al. | |
| 2005/0245007 | A1 | 11/2005 | Azami et al. | |
| 2005/0277028 | A1 | 12/2005 | Yamazaki et al. | |
| 2007/0212826 | A1 | 9/2007 | Yamazaki et al. | |

FOREIGN PATENT DOCUMENTS

| | | |
|---|---|---|
| JP | 01-276621 | 11/1989 |
| JP | 02-181419 A | 7/1990 |
| JP | 07-326769 | 12/1995 |
| JP | 09-050961 A | 2/1997 |
| JP | 09-270393 | 10/1997 |
| JP | 10-199809 A | 7/1998 |
| JP | 11-354463 | 12/1999 |
| JP | 2000-058478 | 2/2000 |
| JP | 2000-299470 A | 10/2000 |
| JP | 2001-074950 | 3/2001 |
| JP | 2001-156017 | 6/2001 |
| JP | 2003-045890 | 2/2003 |
| JP | 2003-059831 | 2/2003 |
| JP | 2003-086505 | 3/2003 |
| JP | 2003-086507 | 3/2003 |
| JP | 2004-087620 A | 3/2004 |
| JP | 2004-241421 A | 8/2004 |

* cited by examiner

BEAM IRRADIATION APPARATUS, BEAM IRRADIATION METHOD, AND METHOD FOR MANUFACTURING SEMICONDUCTOR DEVICE

CROSS-REFERENCE TO RELATED APPLICATIONS

This application is a divisional of U.S. application Ser. No. 10/820,781 filed Apr. 9, 2004, now U.S. Pat. No. 7,220,627.

BACKGROUND OF THE INVENTION

1. Field of the Invention

The present invention relates to a beam irradiation apparatus and a beam irradiation method. Moreover, the present invention relates to a method for manufacturing a thin film transistor using the apparatus and the method.

2. Description of Related Art

A research has been conducted concerning a thin film transistor having a channel-forming region in a poly-crystalline semiconductor film (hereinafter this thin film transistor is referred to as poly-crystalline TFT) as a semiconductor element in a display device, an integrated circuit, or the like. With the development of the display device and the integrated circuit, further enhancement of the characteristic of the poly-crystalline TFT has been expected.

Consequently, in order to enhance the characteristic of the poly-crystalline TFT, crystallization of the semiconductor film by a continuous wave laser irradiation apparatus has been examined. For example, there is a method for crystallizing an a-Si film in such a way that the a-Si film is patterned into linear or island-shape over a glass substrate, and then an energy beam output continuously to time from the continuous wave laser irradiation apparatus is irradiated and scanned thereto (Refer to patent document 1). The patent document 1 describes that when the semiconductor thin film is patterned into linear or island-shape in advance, the crack and the like can be prevented because the temperature of the glass substrate does not increase. The patent document 1 also describes in FIG. 29 and FIG. 31 that a blocking plate with an opening provided is used to crystallize only the necessary part of the a-Si film selectively without giving damage to the glass substrate and without peeling the a-Si film.

Moreover, a galvanometer mirror (refer to patent document 2) or a polygon mirror (refer to patent document 3) is used as means for scanning (also referred to as deflecting) the laser light (also referred to as a laser beam). Since the galvanometer mirror and the polygon mirror can easily increase the scanning speed, the burden on the irradiation apparatus can be reduced.

Patent Document 1
 Japanese Patent Unexamined Publication No. 2003-86505 bulletin Patent Document 2
 Japanese Patent Unexamined Publication No. 2003-86507 bulletin Patent Document 3
 Japanese Patent Unexamined Publication No. 2003-45890 bulletin

SUMMARY OF THE INVENTION

When the galvanometer mirror or the polygon mirror is used to irradiate such a continuous wave laser beam (hereinafter referred to as a CW beam, and the apparatus for oscillating the CW beam is referred to as a CW laser irradiation apparatus) to the irradiated object such as the substrate, a scanning width is limited. Therefore, the laser light needs to be scanned repeatedly and there is a region where the scanning of the laser light stops. The region where the scanning of the laser light stops makes it difficult to perform the laser processing uniformly.

Furthermore, the speed of the laser light scanned by the scanning means such as the galvanometer mirror or the polygon mirror was not constant in the center portion and in the end portion of the scanning width. For example, the laser light made to scan in one direction by the galvanometer mirror decelerates toward a region where the direction of the back-and-forth motion changes (the point in which the galvanometer mirror stops and its vicinity) and its scanning speed becomes zero at last and the laser light accelerates thereafter. In such regions where the scanning speed decelerates, accelerates, and becomes zero, the irradiation time becomes longer so that the object is irradiated with excessive energy. As a result, when the amorphous semiconductor film is used as the irradiated object, there is a risk that the amorphous semiconductor film is peeled or the like.

On the other hand, although the scanning speed does not become zero when the polygon mirror is employed, the scanning speed is not constant yet in the center portion and in the end portion of the scanning width. As a result, there is also a risk, as well as the galvanometer mirror, that the amorphous semiconductor film is peeled or the like.

It is concerned that when the semiconductor film is peeled, the peeled film is spattered to the normal film, which results in the roughness of the normal film. The present inventors recognize that it is a problem in the field of semiconductor that the scanning speed of laser light is not constant as described above.

Although there is a method in which the semiconductor film, the irradiated object, is patterned into linear or island-shape at an element-by element basis before the CW beam is irradiated, this method requires the accurate position control in the beam irradiation, thereby increasing the burden on the irradiation apparatus. Moreover, in the case where the crystallization is performed by irradiating the beam after the semiconductor film is patterned, since the semiconductor film is melted by the beam irradiation, it is difficult to keep the shape of the end portion of the patterned semiconductor film and to obtain the desired pattern shape.

As above, there is room for improvement in order to perform uniform irradiation of CW beam. Particularly when a large substrate and mass production are taken into account, there are many points to be improved.

Consequently, it is an object of the present invention to solve the problem in the end portion of the scanning width of the beam irradiation in the case of irradiating the beam with the use of the galvanometer mirror or the polygon mirror. In particular, the object of the present invention is to provide an apparatus for irradiating a uniform beam to the irradiated object (a beam irradiation apparatus or a laser irradiation apparatus) and a beam irradiation method in consideration of the large substrate and the mass production. Furthermore, it is also an object of the present invention to provide uniform laser processing, that is, laser annealing (including crystallization and activation) to a thin film transistor (hereinafter referred to as TFT) using the beam irradiation apparatus and the beam irradiation method as above.

In the present invention made in view of the above problems, in the case where the laser spot (irradiated region) of the energy beam output continuously (referred to as a CW beam, which is specifically referred to as a CW laser when a laser is used as the light source) on the irradiated object is scanned in such a way that the spot moves back and forth by the scanning means (deflecting means) or the like, when the scanning speed (moving speed) of the spot is not the predetermined value, that is to say when the scanning speed is not constant, the beam is irradiated to the outside of an element-forming region.

The scanning speed (moving speed) of the spot that is not the predetermined value means the speed that is not constant, for example the speed when it accelerates, decelerates, and when it is zero.

It is noted that the region where the speed is not constant or where the speed accelerates, decelerates, or becomes zero means the positions where the scanning direction changes or where the scanning starts (one end) and where the scanning ends (the other end).

In other words, the present invention can change the scanning direction outside the element-forming region. It should be noted that the term "position" herein used includes its vicinity as appropriate.

The element-forming region indicates the region where the integrated circuit or the display device having a driver circuit portion and a display portion having the semiconductor film is formed. Therefore, the outside of the element-forming region indicates the area between the regions where the display device or the integrated-circuit is formed, and also indicates the area between the display portion and the driver circuit portion.

It is noted that the display device includes a liquid crystal display device and a light-emitting device having a self light-emitting element. And the integrated circuit includes a CPU, a memory, and the like.

Thus, the uniform process can be performed by controlling the beam irradiation position so that the beam is irradiated selectively to the outside of the element-forming region when the scanning speed is not predetermined value.

According to the present invention, it is possible to form the semiconductor film in which the element-forming region, which is the whole surface at a panel-by-panel basis, is crystallized uniformly. Therefore, compared with the method in which the crystalline semiconductor film is provided at the element-by-element basis, the region for providing the thin film transistor is not limited, thereby increasing the degree of freedom of the design.

The scanning means have a specular body (also referred to as a mirror) for changing the irradiation position of the beam to the irradiated object continuously or rectangularly. As the scanning means, it is possible to use, for example, means having one or a plurality of specular bodies, means having a plurality of specular bodies arranged continuously, or means having the other mirror. Specifically, the galvanometer mirror or the polygon mirror can be used as the scanning means.

As the other scanning means, a specular body having a plane surface or a curved surface which is fixed to a shaft and which can turn (including rotation and vibration) using the shaft as its center may be also used. On this occasion, the shaft has means for controlling the turning of the specular body provided in one end or in opposite ends thereof. Controlling the turning indicates controlling the rotational speed and the like in the case of rotation and controlling the amplitude of vibration and the like in the case of vibration. In addition, when a plurality of the specular bodies is provided, reflection condition in each of the plurality of specular bodies may be different. Taking it into account, it is preferred to employ one specular body.

It is noted that when the galvanometer mirror or the polygon mirror is used, the processing time can be reduced because the time required for the acceleration or the deceleration is short in spite of the considerably high scanning speed, which ranges from ten to several thousands mm/s. This is because the galvanometer mirror and the polygon mirror are lightweight so that the rapid scanning can be performed.

A solid-state laser such as a $YVO_4$ laser, a YAG laser, a YLF laser, a $YAlO_3$ laser, or an Ar laser can be used in an apparatus for emitting an energy beam output continuously (a CW laser irradiation apparatus). The energy beam output continuously emitted from any one of these lasers can be irradiated. In addition, the harmonic of these lasers can be also employed.

Although the laser beam may have any shape, the laser beam is preferably transformed to be linear through an optical system. It is noted that the term "linear" herein used does not mean a line strictly, but means a rectangle having a high aspect ratio (or an oblong shape). For example, the linear beam indicates the rectangular beam having an aspect ratio of 10 or more (preferably in the range of 100 to 10000). For example, the linear beam spot has a length from 150 to 1000 μm in its major axis and a length from 5 to 20 μm in its minor axis. With the laser beam shaped into linear, it is possible to perform the high-throughput process.

In addition, when the scanning speed of the spot is not the predetermined value depending on the scanning width of the laser beam, the beam is irradiated to the outside of the element-forming region.

It is noted that after the irradiated object and the beam relatively move to process one line, they move on to the next line. Such a relative movement is repeated to process a large area. Therefore, the scanning speed of the laser beam and the scanning speed of the irradiated object are set so as to synchronize each other. In other words, first scanning means for changing the traveling direction (scanning direction) of the laser beam and second scanning means for scanning the irradiated object relative to the first scanning means are controlled so as to synchronize each other.

In addition, it is preferable to arrange an fθ lens between the irradiated object and the scanning means in order to make the spot of the laser beam have a constant shape. It is more preferable to employ a telecentric fθ lens that can make an incidence angle constant. Although there is a limit for enlarging the size of such an fθ lens, the fθ lens can process a wide range of region by moving the irradiated object in XY directions.

In the case of irradiating in the laser beam uniformly, that is, scanning the laser beam at constant speed, the element-forming region in the irradiated object can be irradiated and thus uniform irradiation method of the laser beam can be provided according to the present invention.

Moreover, when a semiconductor film is used as the irradiated object, it is possible to provide the poly-crystalline TFT having uniform crystallinity and uniform electric characteristic. With such a poly-crystalline TFT equipped, advantageous effects such as uniformity of the display and enhancement of the performance can be expected in a liquid crystal display device, a display device such as a light-emitting device having a self light-emitting element and an integrated circuit having a CPU and a memory.

In the present invention, the beam can be irradiated uniformly by irradiating the beam to the outside of the display device, which is the outside of the element-forming region, when the CW beam is employed and when the scanning speed of the beam is not uniform. In other words, the laser annealing with the laser used as the light source can be performed uniformly. As a result, mass productivity is enhanced and the display device can be manufactured at lower cost.

EFFECT OF THE INVENTION

Uniform processing can be performed by using the scanning means of the present invention in which the CW beam or the pulsed beam scanned on the irradiated object is irradiated to the outside of the element-forming region when the scanning direction of the laser beam changes or when the scanning speed is not constant. As a result, the semiconductor film can be annealed uniformly. As above, it is possible to prevent the irradiated object, particularly the semiconductor film, from being peeled. In addition, the efficient laser annealing of the present invention is preferable in the case of using the large substrate.

DETAILED DESCRIPTION OF THE INVENTION

Embodiment Modes of the Invention

Figure 1A:
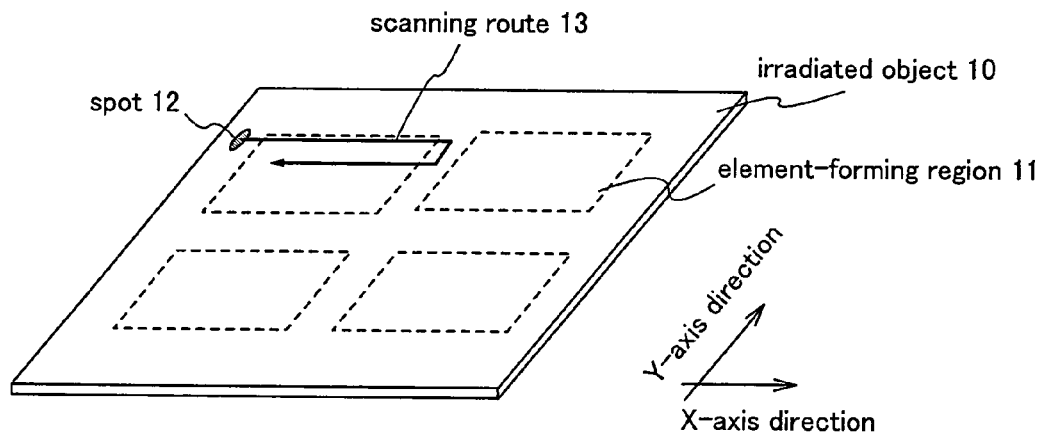
FIGS. 1A-1B are drawings which illustrate a laser irradiation apparatus of the present invention.

Embodiment modes of the present invention are hereinafter explained based on drawings. However, since the present invention can be embodied in many different modes, it is easily understood by those skilled in the art that the modes and the details of the present invention can be changed and modified in various ways unless such changes and modifications depart from the scope and the content of the present invention hereinafter defined. Thus, the present invention is not limited to the description of the embodiment modes.

In addition, the same reference numeral is given to the same part or the part having the similar function throughout the drawings for explaining the embodiment modes. And the explanation to such a part shall not be repeated.

Embodiment Mode 1

The present embodiment mode explains the case in which the laser processing is performed by employing the laser as the light source to the irradiated object in which four element-forming regions are formed.

In a perspective diagram shown in FIG. 1(A), four of an element-forming regions 11 are provided in an irradiated object 10. And relative movements of the laser beam and the irradiated object move a spot 12 along a scanning route 13. The scanning route 13 is in XY directions where a major axis direction (X-axis direction in FIG. 1(A)) and a minor axis direction (Y-axis direction in FIG. 1(A)) are combined. On this occasion, for example, the first scanning means (for example, the galvanometer mirror or the polygon mirror) moves the spot in the major axis direction and the second scanning means (for example, an XY stage) moves the irradiated object in the minor axis direction. As thus described, the laser processing can be performed to the whole irradiated object having a large area can be irradiated with the beam by scanning sequentially (zigzag scanning).

And the scanning speed of the spot moved by the scanning means may not be constant. The scanning speed decelerates toward the point where the scanning means stop, which is the point where the moving direction changes, and at last it becomes zero. Then, it accelerates after the moving direction changes, and it becomes constant. When the scanning speed thus decelerates, accelerates, or is zero, the laser beam is irradiated to the outside of the element-forming region 11.

As a result, uniform laser processing can be performed by irradiating the laser beam to the element-forming region when the scanning speed of the spot is constant.

Figure 1B:
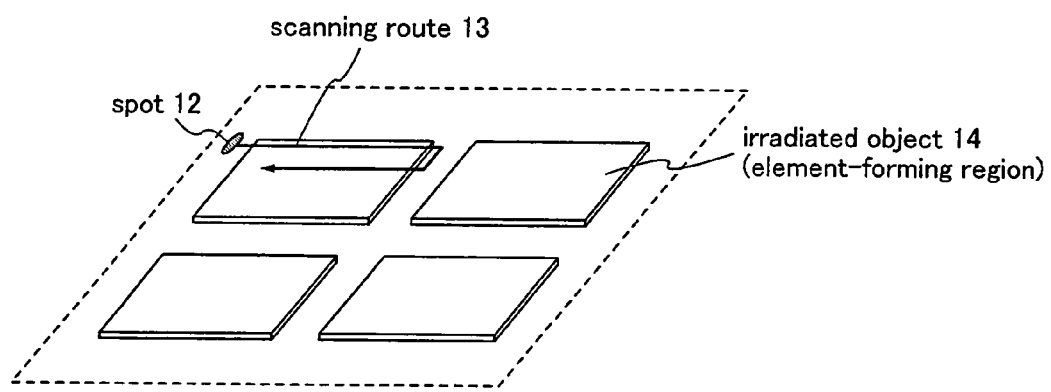

In addition, four element-forming regions 11 are patterned in the irradiated object 14 shown in FIG. 1(B). It is noted that although the element-forming region may be patterned into linear or island-shape, it is preferably patterned to have the size of the final form of the display device or the integrated circuit. As a result of irradiating the laser beam to the region having a certain amount of area such as the display device or the integrated circuit, the scanning position of the spot 12 can be easily controlled, thereby simplifying the structure of the laser irradiation apparatus.

And as well as in FIG. 1(A), the laser beam is irradiated to the outside of the element-forming region 11 when the scanning speed decelerates, accelerates, or is zero. The energy is given excessively to the region where the scanning speed decelerates, accelerates, or is zero because the laser irradiation time is long. As a result, the physical property of the irradiated object varies and the film is peeled. Therefore, it is preferable to remove the semiconductor film outside the element-forming region in advance as shown in FIG. 1(B) because the peeling of the film can be prevented, thereby reducing the adverse affect to the normal film.

In FIG. 1(B), the element-forming region is patterned in advance into the size of the final form of the display device or the like. Therefore, compared to the case of patterning into the size of the element in advance as shown in the patent document 2, the present invention is preferable because the change in the pattern shape due to the melting in the laser irradiation does not have to be cared.

In addition, in FIGS. 1(A) and 1(B), the laser beam and the irradiated object may move relatively, and either the laser beam or the irradiated object, or both of them may move. A stage moving in XY axes may be used as the means for moving the irradiated object. For example, a rail moving in X-axis direction and a rail moving in Y-axis direction are arranged so as to be orthogonalized each other, and the stage with the irradiated object fixed by suction or the like is moved in XY directions. Alternatively, the irradiated object may be floated by the air or the like and be moved in XY directions. In addition, when it moves in the direction of the minor axis of the irradiated region, the stage is controlled so as to synchronize with the timing at which the scanning direction of the laser beam changes. Moreover, in case of using two galvanometer mirrors, the scanning speed of the laser beam can be controlled by the galvanometer mirror.

In particular, when the polygon mirror is used as the scanning means, it is preferable to adjust the distance for moving the stage mirror by mirror. This is because the polygon mirror has a plurality of mirrors so that the direction to which the beam is reflected may be different in the adjacent mirrors.

For example, a practitioner numbers each of mirrors included in the polygon mirror and scans the mirrors once. The practitioner thus understands the characteristic of the motion of each of mirrors so that the practitioner can control the stage movement based on this characteristic.

The present invention can provide the processing method and the irradiation apparatus having high uniformity by the laser beam, particularly the CW laser.

When the irradiation apparatus and the processing method of the present invention are applied to crystallize the semiconductor film, it is possible to provide a crystalline semiconductor film having high uniformity, that is to say, a polycrystalline TFT.

Furthermore, according to the present invention, it is possible to form the semiconductor film in which the element-forming region, which is the whole surface thereof at the panel-by-panel basis, is crystallized uniformly. Therefore, compared to the method in which the crystalline semiconductor film is provided at the element-by-element basis, the region for providing the thin film transistor is not limited, thereby increasing the degree of freedom of the design.

The present embodiment mode explained the case where the irradiated object has four element-forming regions. However, even when one element-forming region is formed or when a plurality of other element-forming regions are formed, uniform laser processing can be performed by making the region not scanned by the laser at the predetermined speed the region outside the element-forming region selectively.

Depending on the scanning width of the laser beam, the laser beam may be irradiated to the outside of the element-forming region between a plurality of display devices, a plurality of integrated circuits, or a plurality of display devices and integrated circuits. For example, in the case of the irradiated object where 9 (3×3) element-forming regions are formed, the laser beam not scanned at the predetermined speed may be irradiated between one element-forming region and two element-forming regions in the first line.

Moreover, the laser beam can be irradiated efficiently to the irradiated object in the present embodiment mode by using a plurality of light sources or by dividing the laser beam. The throughput can be increased particularly in the case of processing the large substrate. In other words, a processing capacity improves drastically.

Embodiment Mode 2

Figure 2:
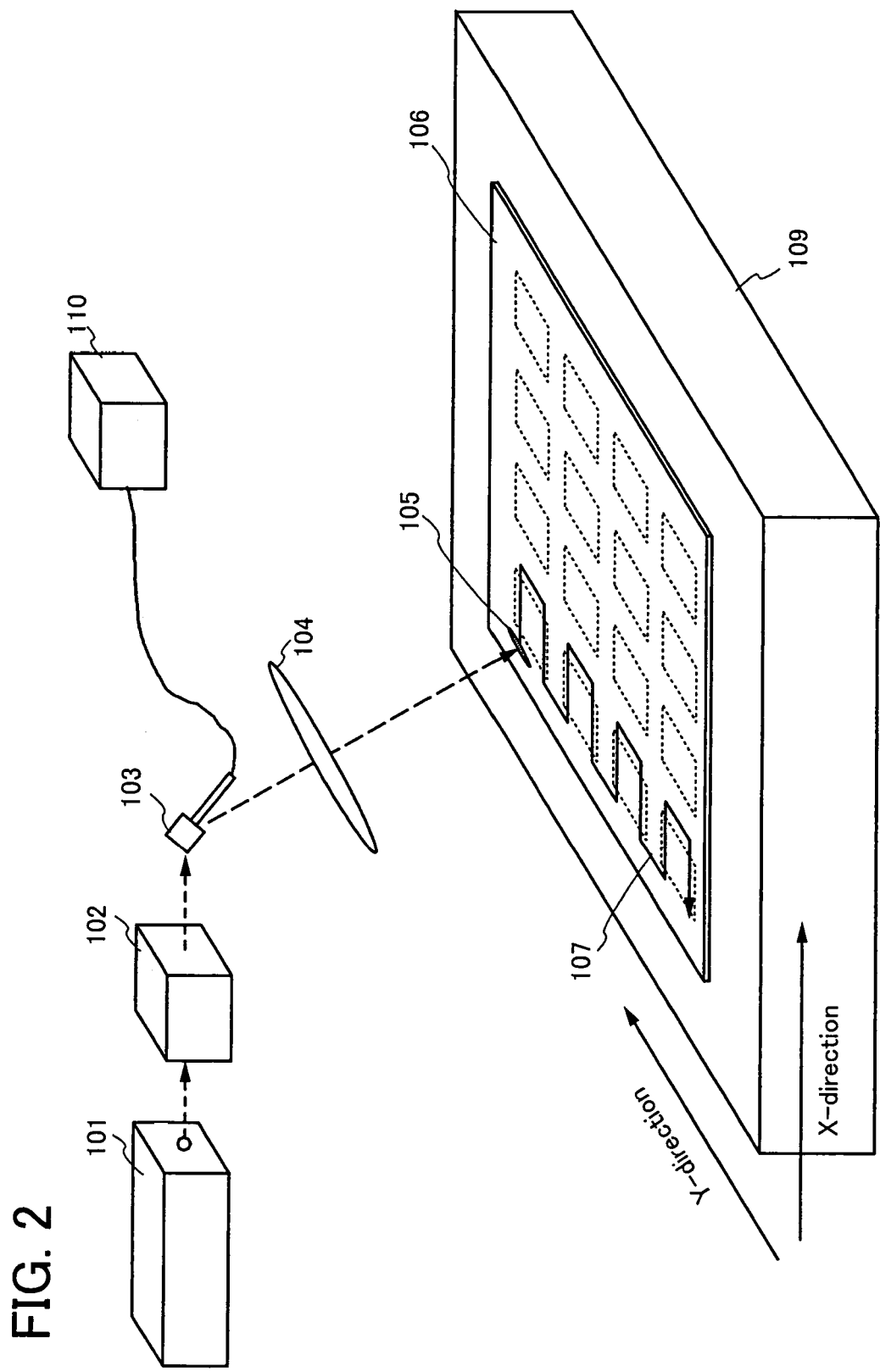
FIG. 2 is a drawing which illustrates a laser irradiation apparatus of the present invention.

The present embodiment mode explains a beam irradiation apparatus, which means a laser irradiation apparatus, and a beam irradiation method, which means a laser irradiation method using a CW laser as one mode of the beam, with reference to FIG. 2. In addition, the present embodiment mode explains one example in which a semiconductor film is used as the irradiated object and a galvanometer mirror is used as the first scanning means.

Initially, the CW laser emitted from a laser oscillator 101 is extended long through an optical system 102 and shaped into linear. Specifically, the laser beam can be shaped into linear by transmitting through a cylindrical lens and a convex lens in the optical system 102.

After that, the laser beam shaped into linear (also referred to as a linear beam) is incident into a semiconductor film 106 through a galvanometer mirror 103 and an fθ lens 104. On this occasion, the linear beam is adjusted so as to form a spot 105 of the laser (hereinafter referred to as a laser spot) having the predetermined size on the semiconductor film. In addition, the fθ lens 104 makes the shape of the laser spot 105 constant on the surface of the irradiated object not depending on the angle of the galvanometer mirror.

It is noted that in FIG. 2, the laser processing, that is, the laser annealing is performed to the semiconductor film formed over a large-sized substrate having a size of 1500 mm (the length in Y-direction in the figure)×1800 mm (the length in X-direction in the figure). The diameter of the fθ lens 104 is practical in the range of approximately 100 to 300 mm and thus it is possible to scan in a width ranging from 100 to 300 mm.

On this occasion, an apparatus (control apparatus) 110 for controlling the vibration of the galvanometer mirror controls the vibration of the galvanometer mirror. In other words, the galvanometer mirror vibrates so as to change the angle of the mirror, and the laser spot 105 is moved in one direction (for example, X-axis direction in the figure). For example, when the galvanometer mirror vibrates in half cycle, the laser spot is moved in X-axis direction on the semiconductor film (outward) by a certain width.

And, the semiconductor film moves in Y-axis direction by an XY stage 109. Then, the laser spot moves in X-axis direction on the semiconductor film by the galvanometer mirror in the same manner (homeward). With such a back-and-forth movement of the laser beam, the laser spot is moved along a route 107 so as to perform the laser annealing to the whole semiconductor film.

It is preferable to make the direction of the back-and-forth movement perpendicular (X-axis direction in the figure) to the direction of the major axis of the laser spot because the throughput is high. Moreover, the laser beam may be incident at an angle more than 0°, which is so-called oblique incidence. In other words, the laser beam may be incident not only in vertical direction but also in other directions.

When the laser beam is moved back and forth, the speed of the laser spot is not constant, that is to say, the speed thereof accelerates, decelerates, or the like in the position where the galvanometer mirror 103 stops and its vicinity (including the region where the spot moves in Y-axis direction). Since it is concerned that uniformity of the laser annealing may be lowered due to such a region, the outside of the element-forming region is irradiated when the speed of the laser spot is not constant in the present invention. Thus, uniform laser annealing can be performed. It is necessary, however, that the length of one side of the display device is within the width scanned by the spot in one line. For example, when the galvanometer mirror is used, since the spot can scan a width ranging from 50 to 300 mm in one line, one side of the element-forming region to become the display device shall not be longer than that.

The galvanometer mirror 103 does pendulum movement at a certain frequency. As a result, the laser spot 105 is moved back and forth regularly, and the XY stage 109 moves by the predetermined length. After finishing the laser annealing to one line, the XY stage 109 moves on to the next line.

For example, a plurality of display devices, each of which becomes a small panel having a size of 50 mm×50 mm, is processed while vibrating the galvanometer mirror 103. For example, when it is assumed that the length required for making the scanning speed of the galvanometer mirror constant is approximately 5 mm, the display devices may be arranged at intervals of at least 5 mm. On this occasion, the range of the semiconductor film having a size of 50 mm×200 μm (corresponding to the region irradiated by the laser scanned in X-axis direction, and 200 μm corresponds to the length of the major axis of the spot) is crystallized. Subsequently, the XY stage 109 moves the semiconductor film 106 by only 200 μm in Y-axis direction and then the laser beam is irradiated by vibrating the galvanometer mirror 103. Such a back-and-forth motion is repeated to perform the laser annealing uniformly in the range of one line having a size of 50 mm×1500 mm. The other region is irradiated with the laser beam in the same manner so as to perform the laser annealing to the whole surface of the semiconductor film. In the case of this embodiment mode, the laser annealing can be performed to the whole surface of the semiconductor film having a size of 1500×1800 mm by repeating the above process 36 times. In consideration of the margin, approximately 890 pieces of the display devices each having a size of 50 mm×50 mm can be manufactured.

In general terms, the CW laser has high coherency. Therefore, it is preferable to make the laser beam incident at an angle more than 0°, which is so-called oblique incidence, so that the reflected light from the rear surface of the irradiated object does not interfere with the reflected light from the surface of the irradiated object on the irradiated surface.

As thus described, in the present invention, when the large region is irradiated using the CW laser, the first scanning means such as the galvanometer mirror or the polygon mirror, the second scanning means such as the XY stage, and the fθ lens, and when the scanning speed of the laser beam is not uniform, the laser beam is irradiated to the outside of the display device to become the outside of the element-forming region. As a result, the laser annealing can be performed uniformly. Moreover, mass productivity is enhanced and a display device can be manufactured at lower cost.

Although the galvanometer mirror is used as the first scanning means in this embodiment mode, the polygon mirror or the other mirror having one or a plurality of specular surfaces being able to rotate can be employed. In addition, although the present embodiment mode explained the case of the display device, the integrated circuit can be also formed by performing the laser processing in the same manner.

Embodiment Mode 3

This embodiment mode explains the case to enhance productivity of the integrated circuit having the thin film transistor by performing the laser processing to the semiconductor film formed over the substrate with a laser irradiation apparatus including a plurality of laser oscillators.

Figure 3A:
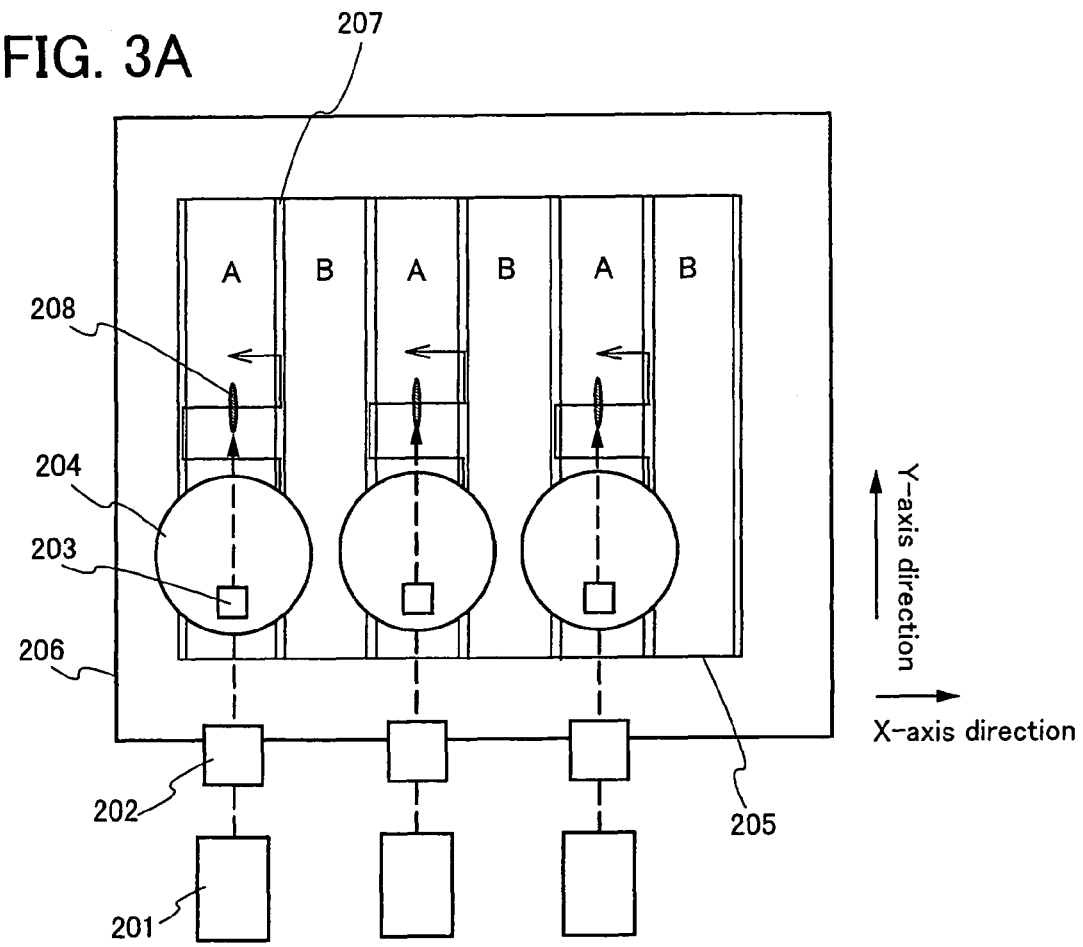
FIGS. 3A-3B are drawings which illustrate a laser irradiation method of the present invention.
Figure 3B:
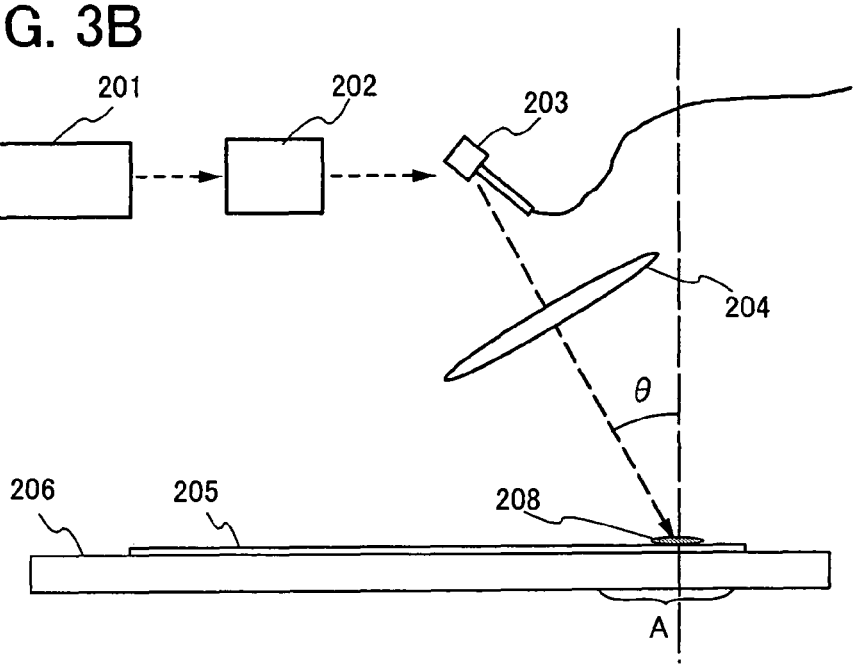

FIG. 3 shows an example to employ three CW laser oscillators 201, three telecentric fθ lenses 204, three galvanometer mirrors 203, and three pairs of slits 207 to perform the laser-sized processing, that is, the laser annealing to a semiconductor film 205 formed over a large substrate having a size of 1500 mm×1800 mm. It is noted that FIG. 3(A) is a top view and FIG. 3(B) is a side view.

An oxide film (a silicon oxide film such as SiON or $SiO_2$) is formed over a substrate as a base film and then a semiconductor film is formed thereon sequentially. The semiconductor film may be formed of the material mainly consisting of silicon by CVD, sputtering, or the like. In this embodiment mode, an amorphous silicon film is formed by the CVD using silane gas. In some film-forming methods, the semiconductor film may contain too much hydrogen to resist the laser annealing. Therefore, in order to increase the probability of the resistivity of the semiconductor film against the laser annealing, the hydrogen concentration in the semiconductor film is preferable on the order of $10^{20}/cm^3$ or less. Therefore, in case that the film contains hydrogen more than the above value at the finishing the film formation, it is preferable to dehydrogenate by the thermal annealing at temperature ranging from 400 to 500° C. for about one hour. The laser annealing is performed to the semiconductor film formed thus. It is noted that the semiconductor film may be patterned into the predetermined shape before the laser annealing.

For example, the second harmonic (wavelength 532 nm) of the beam emitted from an LD-pumped CW $Nd:YVO_4$ laser is used as the laser oscillator 201. The laser oscillator 201 has an output power of 10 W and is $TEM_{00}$ mode. The laser beam spot has a diameter of φ2.3 mm and has a divergence angle of 0.35 mrad.

In addition, since the laser beam having this wavelength transmits through the amorphous silicon film and the substrate, it may be necessary to devise a method for suppressing the inhomogeneous laser annealing due to the interference. In that case, the laser beam is preferably made incident into the semiconductor film 205 at an angle more than 0°, for example. The appropriate incidence angle depends on the shape or the size of the laser beam spot. The direction to which the laser spot 208 is extended, which means the direction of the major axis of the spot, is the Y-axis direction in FIG. 3(A). Although it may be extended to another direction according to the purpose, it is preferable to extend it in the Y-axis direction in order to maximize the throughput in this embodiment mode. For example, when the laser beam spot shaped into a linear ellipse having a size of 400 μm in its major axis and 20 μm in its minor axis on the semiconductor film 205 is set so that the major axis thereof is included in the incidence plane, the appropriate incidence angle θ is approximately 20°.

The telecentric fθ lens 204 has a focal length of approximately 300 mm and has a diameter of φ120 mm. An optical system 202 shapes the laser beam spot into linear. For example, the optical system 202 includes a planoconcave lens having a focal length of 50 mm, a planoconvex lens having a focal length of 200 mm positioned 145 mm apart, a planoconvex cylindrical lens having a focal length of 250 mm positioned 140 mm behind the planoconvex lens, and a planoconcave cylindrical lens having a focal length of 100 mm positioned 145 mm behind the planoconvex cylindrical lens. It is noted that the direction of curvature of the planoconvex cylindrical lens is the same as that of the planoconcave cylindrical lens. Moreover, a galvanometer mirror 203 is arranged approximately 250 mm behind the planoconcave cylindrical lens, and a telecentric fθ lens 204 is arranged in accordance with the specifications of these lenses.

In the laser irradiation apparatus having the optical system as above, the laser beam spot 208 extended to be linear on the semiconductor film 205 is scanned on the semiconductor film 205 at a speed of 500 mm/s by the galvanometer mirror 203. The outside of the region where the integrated circuit is formed is irradiated with the spot 208 of the laser beam when it accelerates or decelerates on the semiconductor film 205. And, a region A where the integrated circuit is formed is irradiated only when the spot is scanned at a constant speed. In addition, since the length of several mm is enough for accelerating the galvanometer mirror, the length of the outside of the region where the integrated circuit is formed is 5 mm. When it is assumed that the width of the poly-crystalline region formed by one operation of the galvanometer mirror determined by the spot size of the laser (the width of the spot in Y-axis direction) is 200 μm, the beam spot 208 of the laser beam is scanned in such a way that after the laser beam spot 208 is scanned 110 mm in X-axis direction by the galvanometer mirror, the XY stage 206 is moved 200 μm in Y direction, and then the laser beam spot is scanned again on the semiconductor film 205 by the galvanometer mirror 203.

Such an operation is repeated to perform the laser annealing to the region A in the figure. After the laser annealing to the region A, the semiconductor film 205 is moved to the position where a region B can be annealed. Then, the laser annealing is performed to the region B as well as the region A. A series of these operations can perform the laser annealing to the whole surface of the semiconductor film 205. Of course, it is not necessary for the laser annealing to be performed all over the semiconductor film 205. It is preferable to perform the laser annealing only to the necessary part thereof because the processing time can be shortened. In such a case, it is necessary to provide a positioning mechanism and the like precisely, and a practitioner may calculate the necessary precision to determine its structure appropriately.

In this embodiment mode, a plurality of telecentric fθ lenses 204 are arranged at intervals. Therefore, the semiconductor film can be irradiated with a plurality of laser beams simultaneously without the adjacent telecentric fθ lenses interfering each other. This makes it possible to obtain high throughput compared with the case to employ only one laser oscillator. Therefore, this structure is appropriate particularly to the large substrate. This embodiment mode employs the telecentric fθ lens so that the laser beam is incident into the semiconductor film at a constant angle. This enables the laser annealing to be performed uniformly. When the uniformity is not required, an fθ lens may be employed alternatively.

The semiconductor film is thus crystallized.

Subsequently, after the semiconductor film is patterned into the predetermined shape as needed, a gate insulating film, a gate electrode, and an impurity region are formed, and then activation is performed. The laser irradiation apparatus and the laser irradiation method of the present invention can be also applied to activate the semiconductor film. And an interlayer insulating film, a source wiring, a drain wiring, a pixel electrode, and the like are formed, and thus an active matrix substrate having a plurality of thin film transistors is formed. In addition, the active matrix substrate can be utilized to form an integrated circuit and the like.

As above, when a plurality of the laser oscillators are used to perform the laser annealing, mass productivity of the thin film transistor and the integrated circuit can be enhanced.

Although this embodiment mode employs a plurality of laser oscillators, one laser beam emitted from one laser oscillator may be divided into a plurality of spots using a mirror or the like.

Moreover, although this embodiment mode employs the galvanometer mirror as the first scanning means, a polygon mirror or a mirror having one or a plurality of specular surfaces being able to rotate can be also employed.

In addition, the active matrix substrate of the present embodiment mode can be employed as a semiconductor element in a liquid crystal display device, a light-emitting device, or the other display device.

Embodiment Mode 4

The present embodiment mode explains a light-emitting device manufactured using the active matrix substrate with reference to FIG. 4.

Figure 4A:
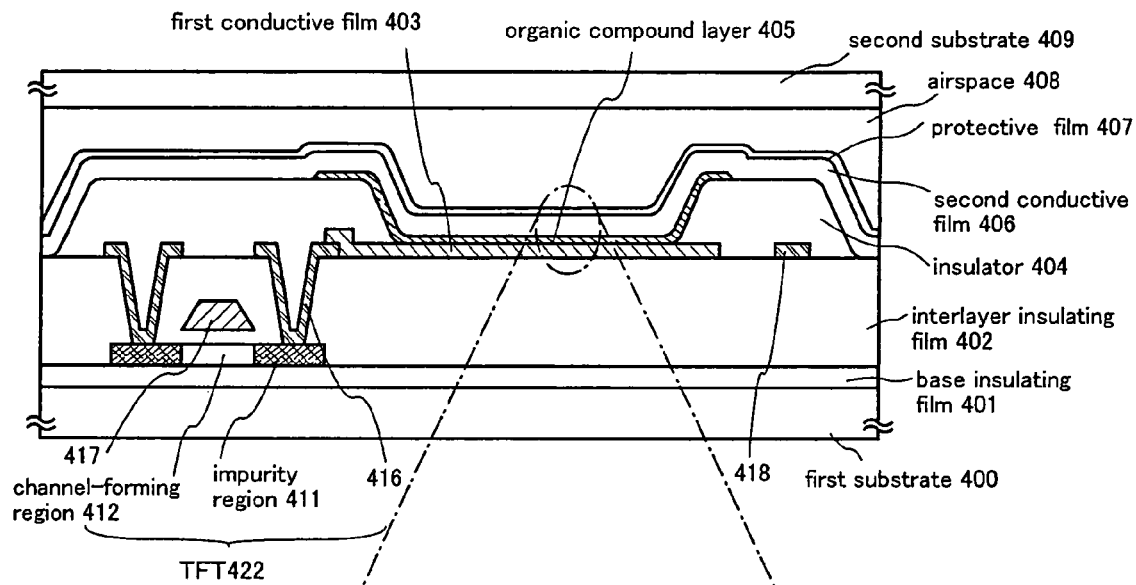
FIGS. 4A-4B are drawings which illustrate a light-emitting device formed using the laser irradiation method of the present invention.
Figure 4B:
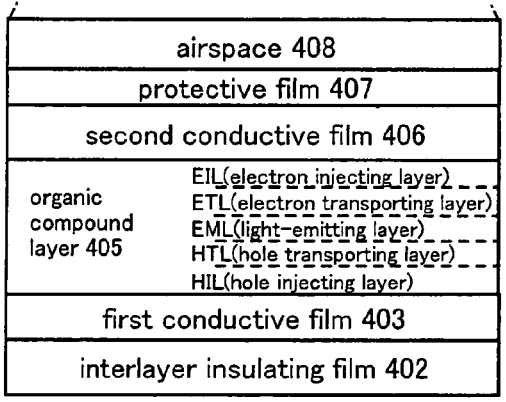

FIG. 4(A) is a cross-sectional view of a light-emitting device, specifically an EL module. In addition, FIG. 4(B) is an enlarged view of the laminated-layer structure of the light-emitting element (having an organic compound layer, a first conductive film, and a second conductive film) of the EL module.

FIG. 4(A) shows a first substrate 400, a base insulating film 401, a TFT 422 having a semiconductor film formed by the laser annealing with the laser irradiation apparatus of the present invention, a first conductive film (electrode) 403, an insulator (also referred to as a barrier diffusion, an embankment, a bank, or a blocking layer) 404, an organic compound layer 405, a second conductive film (electrode) 406, a protective film 407, an airspace 408, and a second substrate 409.

A glass substrate, a quartz substrate, a silicon substrate, a plastic substrate, a metal substrate, a stainless substrate, or a flexible substrate can be used as the first substrate and the second substrate. The flexible substrate is a film-like substrate formed of PET, PES, PEN, acryl, or the like, and when the flexible substrate is used to manufacture a light-emitting device, weight saving is anticipated. It is desirable to form a barrier layer such as an aluminum film (AlON, AlN, AlO, or the like), a carbon film (DLC or the like), or SiN on a surface of the flexible substrate or on both the surface and the rear surface thereof in a single layer or in multi-layers, because the durability and the resistivity against gas can be improved.

In addition, either the first conductive film or the second conductive film is formed of ITO or the like having light-transmittance according to whether the light from the organic compound laser is emitted upward or downward. In addition, when the light is emitted to both upward and downward, the light-transmitting conductive film is used as the first conductive film and the second conductive film.

The TFT 422 (p-channel TFT in this embodiment mode) formed over the first substrate 400 is an element for controlling the current flowing through the organic compound layer 405. The TFT 422 has an impurity region 411 functioning as a drain region (or a source region depending on the polarity), a channel-forming region 412, and a gate electrode 417 provided over the channel-forming region. Furthermore, the TFT 422 has a drain electrode (or a source electrode) 416 for connecting the impurity region, and the first conductive film 403 electrically. Moreover, a wiring 418 such as a power supplying line or a source wiring can be formed simultaneously in the same process as that for forming the drain electrode 416.

A base insulating film 401 (herein the base insulating film is formed of an insulating nitride film as a lower layer and an insulating oxide film as an upper layer) is formed over the first substrate 400 as a base insulating film and a gate insulating film is provided between the gate electrode 417 and the semiconductor film. In addition, each layer of the interlayer insulating film 402 is formed of an organic material or an inorganic material in a single-layer structure or a multi-layers structure. Although it is not illustrated in the figure, one TFT or a plurality of TFTs (n-channel TFT or p-channel TFT) are also provided in one pixel. In addition, although this embodiment mode shows the TFT having one channel-forming region 412, there is no particular limitation, and the TFT may have a plurality of channels, which is called a multi-channel TFT.

In addition, although this embodiment mode explained a top gate type TFT as the example, the present invention can be applied regardless of the TFT structure. For example, the present invention can be applied to a bottom gate type (inversely staggered) TFT and a staggered TFT.

In addition, the first conductive film 403 becomes an anode (or a cathode) of the light-emitting element. When the first conductive film is formed of a transparent conductive film, ITO (alloy of indium oxide and tin oxide), alloy of indium oxide and zinc oxide ($In_2O_3$—ZnO), zinc oxide (ZnO), or the like can be used.

In addition, there is an insulator 404 (also referred to as a bank, a barrier diffusion, a blocking layer, an embankment, or the like) to cover the end portion of the first conductive film 403 (and the wiring 418). The insulator 404 can be made of an inorganic material (silicon oxide, silicon nitride, silicon oxynitride, or the like), a photosensitive or non-photosensitive organic material (polyimide, acryl, polyamide, polyimidamide, resist, or benzocyclobutene), or the layers formed by laminating these materials. It is noted that this embodiment mode uses a photosensitive organic resin covered by the silicon nitride film. For example, when the positive photosensitive acrylic is used as the material of the organic resin, it is preferable that only the upper end portion of the insulator has a curved surface having a curvature radius. In addition, the insulator may be either a negative type, which becomes insoluble in the etchant by the light, or a positive type, which becomes soluble in the etchant by the light.

In addition, the organic compound layer 405 is formed by a vapor deposition method or a coating method. In this embodiment mode, the organic compound layer is formed in a vapor deposition apparatus to obtain uniform film thickness. In order to enhance the reliability, it is preferable to degas by means of vacuum heating (at a temperature ranging from 100 to 250° C.) just before forming the organic compound layer 405. For example, when the vapor deposition method is used, the film is deposited in the film-forming chamber that is vacuum pumped so that the degree of vacuum is $5 \times 10^{-3}$ Torr (0.665 Pa) or less, preferably in the range of $10^{-4}$ to $10^{-16}$ Torr. At the deposition, the organic compound is vaporized by heating it in advance, and it is spattered toward the substrate by opening the shutter. Vaporized organic compound is spattered upward and deposited through an opening provided in a metal mask.

As shown in FIG. 4(B), the organic compound layer (the EL layer) 405 is a laminated-layer of HIL (a hole injecting layer), HTL (a hole transporting layer), EML (a light-emitting layer), ETL (an electron transporting layer), and EIL (an electron injecting layer) that are laminated in order from the anode side. Typically, CuPc is used as the HIL, α-NPD is used as the HTL, BCP is used as the ETL, and BCP:Li is used as the EIL, respectively. It is noted that the organic compound layer may have an inorganic material or may have a mixed material of the organic material and the inorganic material.

In addition, in the case of a full color display, the materials each showing the light emission of red (R), green (G), and blue (B) respectively as the organic compound layer (EL layer) 405 may be formed selectively by the vapor deposition method using respective deposition masks or by an ink-jetting method appropriately. It is noted that the ink-jetting method is a method to spray (discharge) selectively a droplet (also referred to as a dot) of the composition in which a material of the conductive film, the insulating film, or the like is mixed. Specifically, CuPc or PEDOT is used as the HIL, α-NPD is used as the HTL, BCP or $Alq_3$ is used as the ETL, and BCP:Li or $CaF_2$ is used as the EIL, respectively. In addition, for example, $Alq_3$ doped with dopant corresponding to each luminescent color of R, G, and B (DCM or the like in the case of R, DMQD or the like in the case of G) may be used as EML. It is noted that the structure of the organic compound layer is not limited to the laminated-layer structure as above.

More specific laminated-layer structure of the organic compound layer is explained as follows. In the case of forming the organic compound layer 405 to show red light emission, after forming CuPc in 30 nm thick as HIL and forming α-NPD in 60 nm thick as HTL, the same mask is used to form $Alq_3$ with $DCM_2$ and rubrene added in 40 nm thick as a red light-emitting layer. After that, BCP is formed as the electron transporting layer in 40 nm thick, and then BCP with Li added is formed in 1 nm thick as the electron injecting layer. In addition, in the case of forming the organic compound layer showing green light emission, after forming CuPc in 30 nm thick as HIL and forming α-NPD in 60 nm thick as HTL, the same deposition mask is used to form $Alq_3$ with coumarin 545T added in 40 nm thick as a green light-emitting layer. After that, BCP is formed in 40 nm thick as the electron transporting layer, and then BCP with Li added is formed in 1 nm thick as the electron injecting layer. In addition, in the case of forming a layer including the organic compound layer showing blue light emission, after forming CuPc in 30 nm thick as HIL and forming α-NPD in 60 nm thick as HTL, the same mask is used to form bis[2-(2-hydroxyphenyl)benzoxazolate]zinc: $Zn(PBO)_2$ in 10 nm thick as a light-emitting layer. After that, BCP is formed in 40 nm thick as the electron transporting layer, and then BCP with Li added is formed in 1 nm thick as the electron injecting layer.

Among the organic compound layers of these colors, CuPc layer and α-NPD layer common to all the colors can be formed all over the pixel portion. In addition, the mask can be shared among these colors. For example, after forming the red organic compound layer, the mask is moved to form the green organic compound layer. Then the mask is moved again to form the blue organic compound layer. It is noted that the order of the organic compound layer of each color to be formed may be set appropriately.

In addition, in the case of white light emission, a full color display may be performed by providing a color filter or a color conversion layer separately. The color filter or the color conversion layer with respect to the white light emitting upward may be pasted with the first substrate after providing it to the second substrate. In addition, the color filter or the color conversion layer with respect to the white light emitting downward can be formed through the insulating film after forming the drain electrode (or the source electrode) 416. After that, the insulating film and the second conductive film are formed in order over the color filter or the color conversion layer, and the drain electrode (or the source electrode) 416 may be connected to the second conductive film through a contact formed in the insulating film.

It is thus possible to provide a light-emitting device having the highly homogeneous crystalline semiconductor film with the laser irradiation apparatus and the laser irradiation method of the present invention. As a result, it is possible to provide the light-emitting device in which the display unevenness due to the inhomogeneous laser beam is reduced in the display portion.

It is noted that the active matrix substrate of the present invention can be applied to the liquid crystal display device and the other display device, and further to the semiconductor integrated circuit and CPU.

Embodiment Mode 5

The active matrix substrate manufactured by the present invention can be applied to various kinds of electronic instruments. As the electronic instrument, a personal digital assistance (a mobile phone, a mobile computer, a mobile game machine, an electronic book, or the like), a video camera, a digital camera, a goggle type display, a display device, a navigation system, and the like are given. FIG. 5 shows specific examples of these electronic instruments.

Figure 5A:
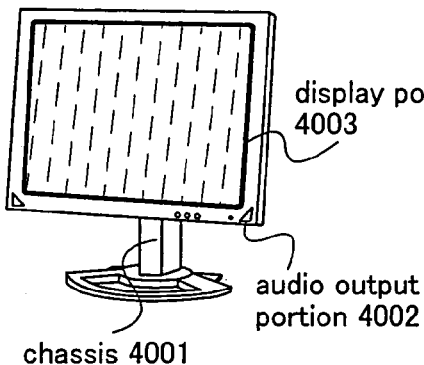
FIGS. 5A-5E are drawings which illustrate electronic instruments formed using the laser irradiation method of the present invention.

FIG. 5(A) is a display including a chassis 4001, an audio output portion 4002, a display portion 4003, and the like. The active matrix substrate formed by the present invention can complete the display portion 4003 having a liquid crystal material or a light-emitting element. The display device includes all the information display devices for a personal computer, for TV broadcast reception, for advertisement, and the like.

Figure 5B:
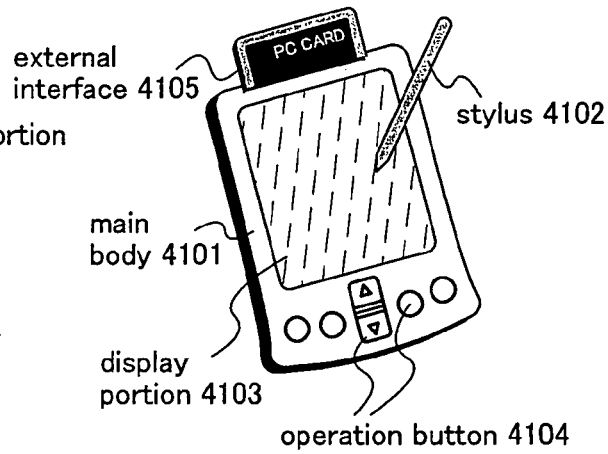

FIG. 5(B) is a mobile computer including a main body 4101, a stylus 4102, a display portion 4103, an operation button 4104, an external interface 4105, and the like. The active matrix substrate formed by the present invention can complete the display portion 4103 having a liquid crystal material or a light-emitting element.

Figure 5C:
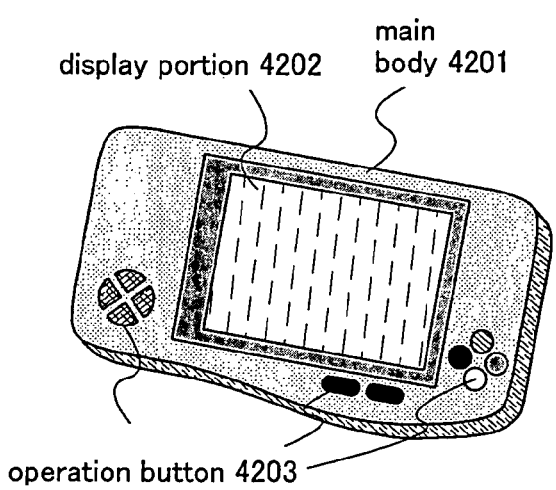

FIG. 5(C) is a game machine including a main body 4201, a display portion 4202, an operation button 4203, and the like. The active matrix substrate formed by the present invention can complete the display portion 4202 having a liquid crystal material or a light-emitting element.

Figure 5D:
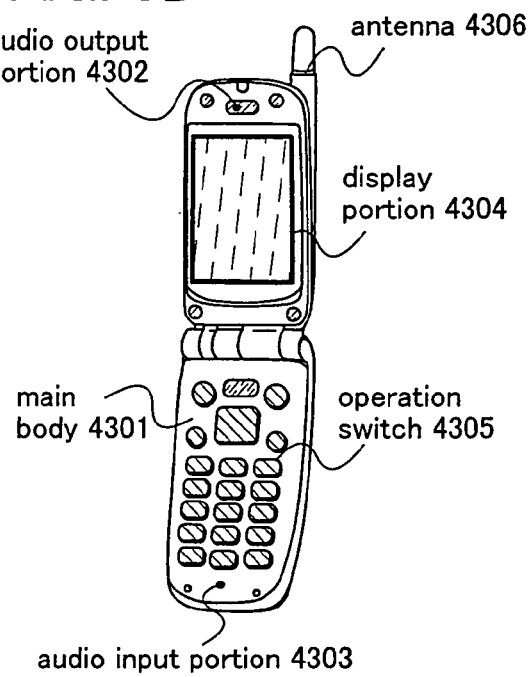

FIG. 5(D) is a mobile phone including a main body 4301, an audio output portion 4302, an audio input portion 4303, a display portion 4304, an operation switch 4305, an antenna 4306, and the like. The active matrix substrate formed by the present invention can complete the display portion 4304 having a liquid crystal material or a light-emitting element.

Figure 5E:
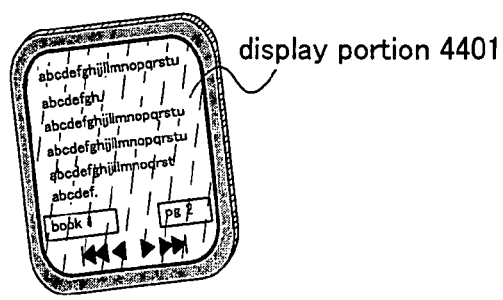

FIG. 5(E) is an electronic book reader including a display portion 4401 and the like. The active matrix substrate formed by the present invention can complete the display portion 4401 having a liquid crystal material or a light-emitting element.

As above, the present invention can be applied in a wide range, and can be applied to the electronic instruments in every field. In particular, it is possible to make the electronic instrument lightweight and thin when the flexible substrate is used as the insulating substrate of the active matrix substrate Embodiment Mode 6

The present invention is applied not only to the CW beam but also to the energy beam output in a pulse oscillation (a pulsed beam, particularly referred to as a pulsed laser when using the laser as the light source), which has the same advantageous effect provided that a crystal grain grown continuously toward the scanning direction can be obtained by oscillating the laser light having the oscillation frequency so that the next pulsed laser light is irradiated within the period from the time that the semiconductor film is melted with the laser light until the semiconductor film is solidified. In other words, the present invention may employ a pulsed beam in which the lower limit in the period of a pulse oscillation (oscillation frequency) is determined so that the period of a pulse oscillation becomes shorter than the period from the time that the semiconductor film is melted until the semiconductor film is solidified completely.

For example, the specific oscillation frequency of the pulsed laser using the laser as the light source is set to 10 MHz or more, which is considerably higher than that of the pulsed laser to be used usually having an oscillation frequency in the range of several tens to several hundreds Hz.

The reason why the present invention employs the pulsed laser having such high frequency is explained as follows. When a general pulsed laser is employed, it is said that it takes several tens to several hundreds nsec to solidify the semiconductor film completely after the semiconductor film is irradiated with the laser light. With the pulsed laser light having a frequency of 10 MHz or more applied thereto, it is possible to irradiate the next pulsed laser light within the period from the time that the semiconductor film is melted by the laser light until the semiconductor film is solidified. Therefore, unlike the case using the conventional pulsed laser, the interface between the solid phase and the liquid phase can be moved continuously in the semiconductor film, thereby forming the semiconductor film having a crystal grain grown continuously toward the scanning direction. Specifically, it is possible to form an aggregation of crystal grains, each of which has a width ranging from 10 to 30 μm in the scanning direction and a width ranging from 1 to 5 μm in the direction perpendicular to the scanning direction, which is the crystal grain as large as that formed with the CW laser. It is also possible to form a semiconductor film having few crystal grain boundaries at least in the carrier transporting direction of TFT by forming a crystal grain of a single crystal extended long along the scanning direction.

When the oscillation at the frequency described above is assumed to be possible, a beam emitted from a laser selected from the group consisting of an Ar laser, a Kr laser, an excimer laser, a $CO_2$ laser, a YAG laser, a $Y_2O_3$ laser, a $YVO_4$ laser, a YLF laser, a $YalO_3$ laser, a glass laser, a ruby laser, an alexandrite laser, a Ti: Sapphire laser, a copper vapor laser, and a gold vapor laser can be used as the pulsed beam.

For example, it is possible to use light emitted from the $YVO_4$ laser having an output power of 2 W, an oscillation mode of TEM(00), the second harmonic (532 nm), an oscillation frequency of 80 MHz, and a pulse width of 12 psec. Moreover, a pulsed laser irradiation apparatus having this laser oscillator can be used. In addition, the beam spot can be shaped into a rectangular spot having a size of 10 μm in its minor axis and 100 μm in its major axis on the surface of the semiconductor film by shaping the laser light through the optical system. When the oscillation frequency is set to 80 MHz, the interface between the solid phase and the liquid phase can be moved continuously, thereby forming the crystal grain grown continuously toward the scanning direction. It is thus possible to form a semiconductor film having few crystal grain boundaries at least in the channel direction of TFT by forming a grain of a single crystal extended long along the scanning direction.

In other words, in the case of using either the CW laser beam or the pulsed laser beam, in the present invention, the laser beam is irradiated to the outside of the element-forming region when the scanning speed of the spot of the laser light is not the predetermined value.

What is claimed is:

1. A method for manufacturing a thin film transistor comprising the steps of:

irradiating a semiconductor film with an energy beam through an fθ lens while turning a mirror so that the energy beam is applied selectively to the outside of a first element forming region and a second element forming region when a scanning speed is not constant;

forming the first element forming region and the second element forming region using portions of the irradiated semiconductor film;

forming a gate electrode in the first element forming region and a gate electrode in the second element forming region over the irradiated semiconductor film; and forming an impurity region in the first element forming region and an impurity region in the second element forming region in the irradiated semiconductor film using each gate electrode as a mask, wherein a scanning row of the energy beam changes outside and between the first element forming region and the second element forming region.

2. A method for manufacturing a thin film transistor according to claim 1, wherein the mirror is a galvanometer mirror or a polygon mirror.

3. A method for manufacturing a thin film transistor according to claim 1, wherein the energy beam is a continuous wave laser beam.

4. A method for manufacturing a thin film transistor according to claim 1, wherein the energy beam is a pulsed laser beam which has a frequency of 10 MHz or more.

5. A method for manufacturing a thin film transistor according to claim 1, wherein the energy beam is emitted from a continuous wave laser selected from the group consisting of an Ar laser, a YAG laser, a $YVO_4$ laser, a YLF laser, and a $YAlO_3$ laser.

6. A method for manufacturing a thin film transistor according to claim 1,
wherein an interface between a solid phase and a liquid phase is continuously moved in the semiconductor film by irradiating the energy beam to the semiconductor film.

7. A method for manufacturing a thin film transistor according to claim 1,
wherein a crystal grain is grown continuously in a scanning direction of the energy beam in the irradiated semiconductor film.

8. A method for manufacturing a thin film transistor according to claim 1,
wherein the first element forming region is a region where a display portion is formed and the second element forming region is a region where a driver circuit is formed.

9. A method for manufacturing a thin film transistor according to claim 1,
wherein the first element forming region is a region where a display device or an integrated circuit is formed and the second element forming region is a region where the display device or the integrated circuit is formed.

10. A method for manufacturing a thin film transistor according to claim 1,
wherein the thin film transistor is incorporated into a semiconductor device which is further incorporated into at least one selected from the group consisting of a display, a mobile computer, a game machine, and an electronic book reader.

11. A method for manufacturing a thin film transistor according to claim 1,
wherein the fθ lens is a telecentric fθ lens.

12. A method for manufacturing a thin film transistor comprising the steps of:
irradiating a semiconductor film with an energy beam through an fθ lens while turning a mirror so that the energy beam is applied selectively to the outside of a first element forming region and a second element forming region when a scanning speed is not constant;
forming the first element forming region and the second element forming region using portions of the irradiated semiconductor film;
forming a gate electrode in the first element forming region and a gate electrode in the second element forming region over the irradiated semiconductor film; and
forming an impurity region in the first element forming region and an impurity region in the second element forming region in the irradiated semiconductor film using each gate electrode as a mask,
wherein the energy beam starts or ends irradiation from outside the first element forming region and the second element forming region and changes a scanning row between the first element forming region and the second element forming region.

13. A method for manufacturing a thin film transistor according to claim 12,
wherein the mirror is a galvanometer mirror or a polygon mirror.

14. A method for manufacturing a thin film transistor according to claim 12,
wherein the energy beam is a continuous wave laser beam.

15. A method for manufacturing a thin film transistor according to claim 12,
wherein the energy beam is a pulsed laser beam which has a frequency of 10 MHz or more.

16. A method for manufacturing a thin film transistor according to claim 12,
wherein the energy beam is emitted from a continuous wave laser selected from the group consisting of an Ar laser, a YAG laser, a $YVO_4$ laser, a YLF laser, and a $YAIO_3$ laser.

17. A method for manufacturing a thin film transistor according to claim 12,
wherein an interface between a solid phase and a liquid phase is continuously moved in the semiconductor film by irradiating the energy beam to the semiconductor film.

18. A method for manufacturing a thin film transistor according to claim 12,
wherein a crystal grain is grown continuously in a scanning direction of the energy beam in the irradiated semiconductor film.

19. A method for manufacturing a thin film transistor according to claim 12,
wherein the first element forming region is a region where a display portion is formed and the second element forming region is a region where a driver circuit is formed.

20. A method for manufacturing a thin film transistor according to claim 12,
wherein the first element forming region is a region where a display device or an integrated circuit is formed and the second element forming region is a region where the display device or the integrated circuit is formed.

21. A method for manufacturing a thin film transistor according to claim 12,
wherein the thin film transistor is incorporated into a semiconductor device which is further incorporated into at least one selected from the group consisting of a display, a mobile computer, a game machine, and an electronic book reader.

22. A method for manufacturing a thin film transistor according to claim 12,
wherein the fθ lens is a telecentric fθ lens.

23. A method for manufacturing a semiconductor device comprising the steps of:
forming a semiconductor film over a substrate;
crystallizing the semiconductor film by irradiating the semiconductor film with an energy beam through an fθ lens while turning a mirror so that the energy beam is applied selectively to the outside of a plurality of semiconductor islands when a scanning speed is not constant;
forming the plurality of semiconductor islands using the crystallized semiconductor film;
forming a first circuit using one of the plurality of semiconductor islands over the substrate; and
forming a second circuit using another one of the plurality of semiconductor islands over the substrate,
wherein the energy beam is irradiated outside and between the first circuit and the second circuit while changing a scanning row of the energy beam.

24. A method for manufacturing a semiconductor device according to claim 23,
wherein the mirror is a galvanometer mirror or a polygon mirror.

25. A method for manufacturing a semiconductor device according to claim 23,
wherein the energy beam is a continuous wave laser beam.

26. A method for manufacturing a semiconductor device according to claim 23,
wherein the energy beam is a pulsed laser beam which has a frequency of 10 MHz or more.

27. A method for manufacturing a semiconductor device according to claim 23,
wherein the energy beam is emitted from a continuous wave laser selected from the group consisting of an Ar laser, a YAG laser, a YVO$_4$ laser, a YLF laser, and a YAlO$_3$ laser.

28. A method for manufacturing a semiconductor device according to claim 23,
wherein an interface between a solid phase and a liquid phase is continuously moved in the semiconductor film by irradiating the energy beam to the semiconductor film.

29. A method for manufacturing a semiconductor device according to claim 23,
wherein a crystal grain is grown continuously in a scanning direction of the energy beam in the crystallized semiconductor film.

30. A method for manufacturing a semiconductor device according to claim 23,
wherein a region in which the first circuit is formed is a region where a display portion is formed, and a region in which the second circuit is formed is a region where a driver circuit is formed.

31. A method for manufacturing a semiconductor device according to claim 23,
wherein a region in which the first circuit is formed is a region where a display device or an integrated circuit is formed, and a region in which the second circuit is formed is a region where the display device or the integrated circuit is formed.

32. A method for manufacturing a semiconductor device according to claim 23,
wherein the semiconductor device is incorporated into at least one selected from the group consisting of a display, a mobile computer, a game machine, and an electronic book reader.

33. A method for manufacturing a semiconductor device according to claim 23,
wherein the fθ lens is a telecentric fθ lens.

34. A method for manufacturing a semiconductor device comprising the steps of:
forming a semiconductor film over a substrate;
crystallizing the semiconductor film by irradiating the semiconductor film with an energy beam through an fθ lens while turning a mirror so that the energy beam is applied selectively to the outside of a plurality of semiconductor islands when a scanning speed is not constant;
forming the plurality of semiconductor islands by using the crystallized semiconductor film;
forming a first circuit using one of the plurality of semiconductor islands over the substrate; and
forming a second circuit using another one of the plurality of semiconductor islands over the substrate,
wherein the energy beam starts or ends irradiation from outside the first circuit and the second circuit and a scanning row of the energy beam changes between the first circuit and the second circuit.

35. A method for manufacturing a semiconductor device according to claim 34,
wherein the mirror is a galvanometer mirror or a polygon mirror.

36. A method for manufacturing a semiconductor device according to claim 34,
wherein the energy beam is a continuous wave laser beam.

37. A method for manufacturing a semiconductor device according to claim 34,
wherein the energy beam is a pulsed laser beam which has a frequency of 10 MHz or more.

38. A method for manufacturing a semiconductor device according to claim 34,
wherein the energy beam is emitted from a continuous wave laser selected from the group consisting of an Ar laser, a YAG laser, a YVO$_4$ laser, a YLF laser, and a YAlO$_3$ laser.

39. A method for manufacturing a semiconductor device according to claim 34,
wherein an interface between a solid phase and a liquid phase is continuously moved in the semiconductor film by irradiating the energy beam to the semiconductor film.

40. A method for manufacturing a semiconductor device according to claim 34,
wherein a crystal grain is grown continuously in a scanning direction of the energy beam in the crystallized semiconductor film.

41. A method for manufacturing a semiconductor device according to claim 34,
wherein a region in which the first circuit is formed is a region where a display portion is formed, and a region in which the second circuit is formed is a region where a driver circuit is formed.

42. A method for manufacturing a semiconductor device according to claim 34,
wherein a region in which the first circuit is formed is a region where a display device or an integrated circuit is formed, and a region in which the second circuit is formed is a region where the display device or the integrated circuit is formed.

43. A method for manufacturing a semiconductor device according to claim 34,
wherein the semiconductor device is incorporated into at least one selected from the group consisting of a display, a mobile computer, a game machine, and an electronic book reader.

44. A method for manufacturing a semiconductor device according to claim 34,
wherein the fθ lens is a telecentric fθ lens.

45. A method for manufacturing a thin film transistor comprising the steps of:
forming a crystalline semiconductor film by irradiating a semiconductor film with an energy beam through an fθ lens while turning a mirror so that the energy beam is applied selectively to the outside of a first element forming region and a second element forming region when a scanning speed is not constant;
forming the first element forming region and the second element forming region using portions of the crystalline semiconductor film;
forming a gate electrode in the first element forming region and a gate electrode in the second element forming region over the crystalline semiconductor film; and
forming an impurity region in the first element forming region and an impurity region in the second element forming region in the crystalline semiconductor film using each gate electrode as a mask,
wherein a scanning row of the energy beam changes outside and between the first element forming region and the second element forming region.

46. A method for manufacturing a thin film transistor according to claim 45,
wherein the mirror is a galvanometer mirror or a polygon mirror.

47. A method for manufacturing a thin film transistor according to claim 45,
wherein the energy beam is a continuous wave laser beam.

48. A method for manufacturing a thin film transistor according to claim 45,
wherein the energy beam is a pulsed laser beam which has a frequency of 10 MHz or more.

49. A method for manufacturing a thin film transistor according to claim 45,
wherein the energy beam is emitted from a continuous wave laser selected from the group consisting of an Ar laser, a YAG laser, a $YVO_4$ laser, a YLF laser, and a $YAlO_3$ laser.

50. A method for manufacturing a thin film transistor according to claim 45,
wherein an interface between a solid phase and a liquid phase is continuously moved in the semiconductor film by irradiating the energy beam to the semiconductor film.

51. A method for manufacturing a thin film transistor according to claim 45,
wherein a crystal grain is grown continuously in a scanning direction of the energy beam in the crystalline semiconductor film.

52. A method for manufacturing a thin film transistor according to claim 45,
wherein the first element forming region is a region where a display portion is formed and the second element forming region is a region where a driver circuit is formed.

53. A method for manufacturing a thin film transistor according to claim 45,
wherein the first element forming region is a region where a display device or an integrated circuit is formed and the second element forming region is a region where the display device or the integrated circuit is formed.

54. A method for manufacturing a thin film transistor according to claim 45,
wherein the thin film transistor is incorporated into a semiconductor device which is further incorporated into at least one selected from the group consisting of a display, a mobile computer, a game machine, and an electronic book reader.

55. A method for manufacturing a thin film transistor according to claim 45,
wherein the fθ lens is a telecentric fθ lens.

56. A method for manufacturing a thin film transistor comprising the steps of:
forming a crystalline semiconductor film by irradiating a semiconductor film with an energy beam through an fθ lens while turning a mirror so that the energy beam is applied selectively to the outside of a first element forming region and a second element forming region when a scanning speed is not constant;
forming the first element forming region and the second element forming region using portions of the crystalline semiconductor film;
forming a gate electrode in the first element forming region and a gate electrode in the second element forming region over the crystalline semiconductor film; and
forming an impurity region in the first element forming region and an impurity region in the second element forming region in the crystalline semiconductor film using each gate electrode as a mask,
wherein the energy beam starts or ends irradiation from outside the first element forming region and the second element forming region and changes a scanning row between the first element forming region and the second element forming region.

57. A method for manufacturing a thin film transistor according to claim 56,
wherein the mirror is a galvanometer mirror or a polygon mirror.

58. A method for manufacturing a thin film transistor according to claim 56,
wherein the energy beam is a continuous wave laser beam.

59. A method for manufacturing a thin film transistor according to claim 56,
wherein the energy beam is a pulsed laser beam which has a frequency of 10 MHz or more.

60. A method for manufacturing a thin film transistor according to claim 56,
wherein the energy beam is emitted from a continuous wave laser selected from the group consisting of an Ar laser, a YAG laser, a $YVO_4$ laser, a YLF laser, and a $YAlO_3$ laser.

61. A method for manufacturing a thin film transistor according to claim 56,
wherein an interface between a solid phase and a liquid phase is continuously moved in the semiconductor film by irradiating the energy beam to the semiconductor film.

62. A method for manufacturing a thin film transistor according to claim 56,
wherein a crystal grain is grown continuously in a scanning direction of the energy beam in the crystalline semiconductor film.

63. A method for manufacturing a thin film transistor according to claim 56,
wherein the first element forming region is a region where a display portion is formed and the second element forming region is a region where a driver circuit is formed.

64. A method for manufacturing a thin film transistor according to claim 56,
wherein the first element forming region is a region where a display device or an integrated circuit is formed and the second element forming region is a region where the display device or the integrated circuit is formed.

65. A method for manufacturing a thin film transistor according to claim 56,
wherein the thin film transistor is incorporated into a semiconductor device which is further incorporated into at least one selected from the group consisting of a display, a mobile computer, a game machine, and an electronic book reader.

66. A method for manufacturing a thin film transistor according to claim 56,
wherein the fθ lens is a telecentric fθ lens.

* * * * *